United States Patent
Kaneko (10) Patent No.: US 6,498,302 B2
(45) Date of Patent: Dec. 24, 2002

(54) MULTIFILAMENTARY OXIDE SUPERCONDUCTING WIRE AND METHOD OF PRODUCING THE SAME, AND STRANDED OXIDE SUPERCONDUCTING WIRE AND METHOD OF PRODUCING THE SAME

(75) Inventor: Tetsuyuki Kaneko, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/820,870

(22) Filed: Mar. 30, 2001

(65) Prior Publication Data

US 2001/0044385 A1 Nov. 22, 2001

(30) Foreign Application Priority Data

Apr. 25, 2000 (JP) .......................................... 2000-123522

(51) Int. Cl.⁷ ............................................... H01B 12/00
(52) U.S. Cl. ..................... 174/125.1; 505/231; 505/431; 29/599
(58) Field of Search ........................ 174/125.1; 505/230, 505/231, 430, 431; 29/594

(56) References Cited

U.S. PATENT DOCUMENTS

| 5,347,085 A | | 9/1994 | Kikucki et al. ............... 505/231 |
| 5,885,938 A | | 3/1999 | Otto et al. ..................... 505/431 |
| 5,908,812 A | * | 6/1999 | Cotton et al. ................. 505/230 |
| 6,271,474 B1 | * | 8/2001 | Fujikami et al. ........... 174/125.1 |
| 6,271,475 B1 | * | 8/2001 | Otto et al. .................. 174/125.1 |

FOREIGN PATENT DOCUMENTS

| JP | 4-262308 | 9/1992 |
| JP | 5-266726 | 10/1993 |
| JP | 6-68727 | 3/1994 |
| JP | 9-259660 | 10/1997 |
| JP | 11-39963 | 12/1999 |

OTHER PUBLICATIONS

Rosner et al., "Status of HTS supersonductors: Progress in improving transport critical current densities in HTS Bi–2223 tapes and coils*", Cryogenics (1992), 32(11):940–948, Butterworth–Heinemann Ltd.

D.C. Labalestier et al., "Position–sensitive measurements of the local critical current density in Ag sheathed High–temperature superconductor $(Bi,Pb)_2Sr_2Ca_2Cu_3O_y$ tapes", Physica C (221):299–303, (1994). North Holland, Elsevier Science B.V.

Grasso et al., "Distribution of the transport critical current density in Ag sheathed $(Bi, Pb)_2Sr_2Ca_2Cu_3O_x$ tapes Produced by rolling", Physica C (241):45–52, (1995), Elsevier Science B.V.

* cited by examiner

*Primary Examiner*—Kaunand Cuneo
*Assistant Examiner*—Jeremy Norris
(74) *Attorney, Agent, or Firm*—Foley & Lardner (57) ABSTRACT

A multifilamentary oxide superconducting wire having a low aspect ratio and a relatively high critical current density, and being suitable for a stranded wire. In order to produce such a wire, a tape-shaped, multifilamentary oxide superconducting wire prepared by the powder-in-tube process is cut along its length. The resulting multifilamentary oxide superconducting wires have a width smaller than that of the tape-shaped wire. The resulting wires typically have an aspect ratio of one to two. The filaments of the resulting wires are in the shape of a ribbon extending in the longitudinal direction, and arranged substantially parallel to each other and in layers. The filaments have an aspect ratio greater than two. The filaments inside include a filament having a portion substantially not covered with the stabilizer.

19 Claims, 7 Drawing Sheets

MULTIFILAMENTARY OXIDE SUPERCONDUCTING WIRE AND METHOD OF PRODUCING THE SAME, AND STRANDED OXIDE SUPERCONDUCTING WIRE AND METHOD OF PRODUCING THE SAME

BACKGROUND OF THE INVENTION

1. Field of the Invention

The present invention relates to multifilamentary oxide superconducting wires and methods of producing the same and stranded oxide superconducting wires formed of the multifilamentary wires that are twined together and methods of producing the same, and particularly to multifilamentary oxide superconducting wires having a relatively high critical current density (Jc) while having a relatively low aspect ratio and methods of producing the same and stranded wires formed of such multifilamentary wires and methods of producing the same.

2. Description of the Related Art

A multifilamentary oxide superconducting wire produced by a "powder-in-tube" process is expected to be applied to superconducting cables, superconducting equipment and the like with liquid-nitrogen cooling. In particular, a tape-shaped multifilamentary superconducting wire having a copper oxide covered with a stabilizing metal is overcoming challenges such as providing a viable critical current density, a viable length, a viable mass-production technique and the like. Typically, a tape-shaped multifilamentary wire is prepared in the powder-in-tube process by packing raw material powder for oxide superconductor in a silver pipe, drawing the same to prepare a monofilamentary wire, inserting a large number of monofilamentary wires into a silver pipe (to prepare a multifilamentary structure), drawing and rolling the multifilamentary structure, and heat-treating the multifilamentary structure to sinter it.

Because of the crystallographic property of the oxide superconductor material, it is advantageous for high Jc that the superconducting filament is shaped flat having a high aspect ratio. Such a flat filament is typically obtained by pressing or rolling. As such, a wire of high Jc is provided in the form of a tape having a relatively high aspect ratio. For example, a typical tape-shaped wire has an aspect ratio of approximately 20, having a width of approximately 4 mm and a thickness of approximately 0.2 mm.

A tape-shaped wire, however, shows anisotropic properties in the direction of the magnetic field applied thereto and readily causes an ac loss in a fluctuating magnetic field. If a cable conductor is formed of a set of the tape-shaped wires, unevenness in impedance between the wires can disadvantageously cause a current drift and the like so that the conductor can have a significant ac loss. In general, the problems of current drift and ac loss can rather be overcome by a stranded structure. It is difficult, however, to form a stranded wire by assembling a large number of tape-shaped wires.

In contrast, round wires having a round cross section are suitable for forming a stranded wire. For example, Japanese Patent Laying-Open No. 4-262308 discloses a round wire with metal, silver or silver alloy and a cylindrical oxide superconductor alternately, concentrically stacked, as seen in cross section. The publication discloses that a multiannular structure having the metal and the oxide superconductor alternately stacked is provide, so that the distance between the interfaces of the oxide superconductor and the metal can be reduced, more specifically, the adjacent interfaces can be not more than 100 µm distant from each other, to provide a c-axis orientation. However, this wire's Jc is a value smaller by one digit than the tape-shaped wire and is not a practically applicable level.

Japanese Patent Laying-Open No. 5-266726 discloses a method of producing an oxide superconducting wire round in cross section with a critical current density hardly depending on the direction of the magnetic field applied. More specifically, the method includes the step of packing a powdery oxide superconductor in a space formed between a metal tube and a metal core inserted therein, the step of performing plastic working on the tube, and the step of sintering the obtained wire. This method provides a superconducting wire having a structure with a cylindrical, oxide superconducting layer between the metal core and the metal tube. This method would not be suitable for producing a wire having a large number of superconducting filaments suitable for coils or the like.

Another example of attempting to enhance the critical current density of a round superconducting wire is disclosed in Cryogenics (1992) Vol. 32, No. 11, 940–948. As regards the round wire disclosed in this literature, 55 monofilamentary rods rectangular in cross section are arranged concentrically in three layers in a silver tube. In the report, the critical current of the obtained wire has not been measured. The wire disclosed in the literature, however, would not have a high Jc.

U.S. Pat. No. 5,347,085 discloses a multifilamentary oxide superconducting wire round in cross section, wherein a plurality of flat, oxide superconducting filaments are arranged in a stabilizer with their widths oriented radially. Thus, in the cross section of the wire, the filaments have their widths oriented circumferentially. In general, this wire would hardly provide higher Jc, because such a process of the wire that performs plastic working in the direction of the widths of the filaments would not enhance a c-axis orientation that can provide a high Jc.

U.S. Pat. No. 5,885,938 discloses a multifilamentary oxide superconducting wire having a low aspect ratio in cross section. This wire has an oxide superconducting crystal whose c-axis is oriented perpendicular to the longitudinal direction of the wire. In this wire, the filament has an aspect ratio typically equal to that of the wire. This low aspect ratio wire is obtained by performing plastic working on a multifilamentary precursor tape and heat-treating it. In this technique, the step of processing a high aspect ratio tape into a low aspect ratio wire would not provide a high Jc. Thus this technique would hardly provide a high Jc wire comparable to the tape-shaped wire.

Japanese Patent Laying-Open Nos. 9-259660 and 11-39963 disclose a multifilamentary oxide superconducting wire and a method of producing the same according to the powder-in-tube process. The improved method disclosed in the publications includes the steps of: packing an oxide superconductor or raw material powder therefor in a tube formed of a stabilizing material; performing plastic working on the tube with the powder packed therein to obtain a tape-shaped wire; packing a plurality of such tape-shaped wires in a tube formed of a stabilizing material; performing plastic working on the tube with the tape-shaped wires packed therein to obtain a wire having a substantially round cross section or a substantially equilaterally polygonal cross section having at least six angles; and heat-treating the wire to produce a sintered body of the oxide superconductor, wherein the powder portion of the tape-shaped wire to be packed in the tube is in the shape of a ribbon having an aspect ratio of 4 to 40 and the wire thermally treated has oxide superconducting filaments each having a thickness in a range from 5 μm to 50 μm. In this method, sufficiently compressed tape-shaped wires can be packed in a tube in an appropriate arrangement to enhance the crystal orientation of the oxide superconducting for a high Jc. However, a higher Jc is also desired over this technique.

Japanese Patent Laying-Open No. 6-68727 (filed on Aug. 19, 1992) discloses a production method including the steps of: providing an oxide superconducting film on an abraded, long substrate; and cutting the substrate to obtain a plurality of superconducting wires. According to this method, the substrate is cut so as to produce a superconducting wire having a lower aspect ratio than the substrate. In this method, however, it is difficult to obtain a multifilamentary wire.

Figure 1:
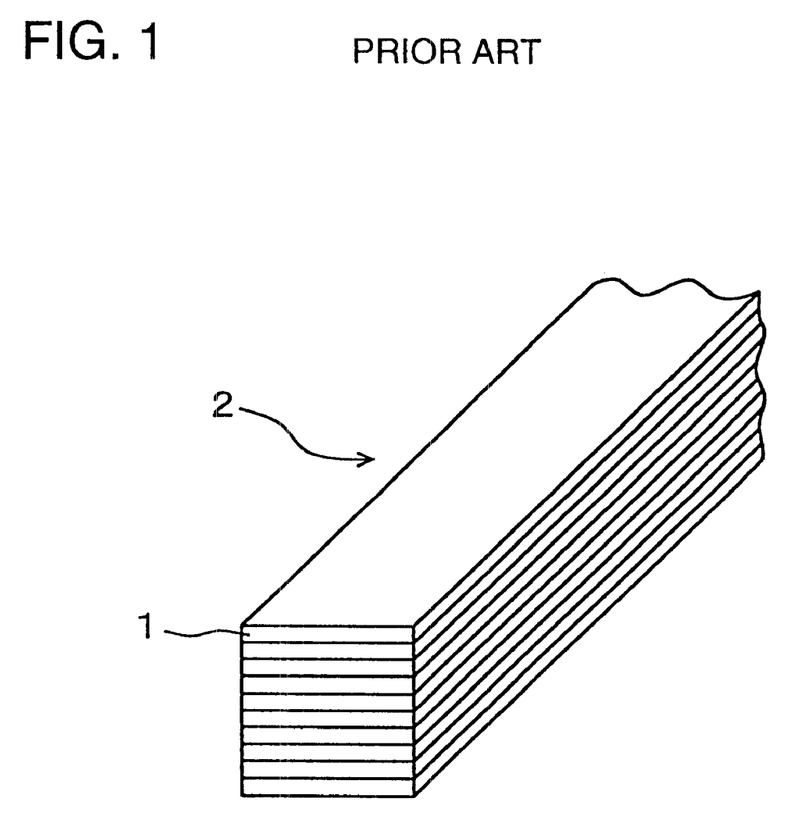
FIG. 1 is a view for illustrating a technique of stacking tape-shaped wires to form a block having a low aspect ratio.

Conventionally there is also a technique, as shown in FIG. 1, stacking and bonding a plurality of tape-shaped, oxide superconducting wires 1 together to provide a block 2. In each tape-shaped wire 1, oxide superconducting filaments are completely covered with a stabilizing material. Block 2 has a lower aspect ratio than tape-shaped wire 1. Block 2 thus obtained, however, has relatively large width and thickness so that it is bulky and unsuitable as a strand for use in producing a stranded wire. Furthermore, block 2 can contain an excessive amount of the stabilizer to provide a Jc per the cross section area of the wire (i.e., overall Jc) reduced.

D. C. Larbalestier et al., Physica C 221 (1994) 299–303 and G. Grasso et al., Physica C 241 (1995) 45–52 disclose that a relatively short, monofilamentary oxide superconducting tape is cut to provide a plurality of pieces thereof for the measurement of the Jc profile in the oxide super conductor. These reports show an interesting result with respect to a monofilament's Jc profile or variation. However, these reports only relate to Jc measurement and they never suggests any information useful in processing a multifilamentary wire.

SUMMARY OF THE INVENTION

One object of the present invention is to provide a multifilamentary oxide superconducting wire having a relatively high Jc and being suitable for a stranded wire and a method of producing the same.

Another object of the present invention is to provide a low aspect ratio, multifilamentary oxide superconducting wire having a relatively high Jc and a method of producing the same.

Still another object of the present invention is to provide a multifilamentary oxide superconducting wire suitable for a solenoid coil and a method of producing the same.

Still another object of the present invention is to provide a stranded oxide superconducting wire having a relatively high Jc and a method of producing the same.

The present invention is directed to a method of producing a multifilamentary oxide superconducting wire, which includes the step of making a cut or cuts in a tape-shaped multifilamentary oxide superconducting wire prepared by a powder-in-tube process, along the longitudinal direction thereof, so that a plurality of multifilamentary oxide superconducting wires smaller in width than the tape-shaped wire are obtained from the tape-shaped wire.

Furthermore the present invention is directed a method of producing a stranded oxide superconducting wire, which includes the steps of: making a cut or cuts in a tape-shaped multifilamentary oxide superconducting wire prepared by a powder-in-tube process, along the longitudinal direction thereof, so that a plurality of multifilamentary oxide superconducting wires smaller in width than the tape-shaped wire are obtained from the tape-shaped wire; and twining a required number of the multifilamentary oxide superconducting wires obtained.

In the present method, preferably, the tape-shaped wire to be cut has an aspect ratio of at least ten. The obtained multifilamentary oxide superconducting wire smaller in width preferably has an aspect ratio of one to two. In the present method the oxide is typically a bismuth-based oxide.

The present invention is also directed to a multifilamentary oxide superconducting wire. The multifilamentary wire is obtained by the method defined above. The multifilamentary wire includes a stabilizer and a plurality of filaments made of an oxide superconductor in contact with the stabilizer, wherein its aspect ratio is one to two, the plurality of filaments are in the shape of a ribbon extending in the longitudinal direction of the multifilamentary wire, the plurality of filaments are arranged substantially parallel to each other and arranged in layers, the plurality of filaments have an aspect ratio greater than that of the multifilamentary wire, and the plurality of filaments include a filament having a portion substantially not covered with the stabilizer.

In the present multifilamentary wire, preferably, the filaments have an aspect ratio greater than two, more preferably have an aspect ratio of at least ten. In the present multifilamentary wire the oxide superconductor is typically a bismuth-based oxide superconductor.

Furthermore the present invention is directed to a stranded oxide superconducting wire which is composed of a plurality of the multifilamentary oxide superconducting wires defined above that are twined into the stranded wire. Each strand constituting the stranded wire has properties of the multifilamentary oxide superconducting wire defined above.

The foregoing and other objects, features, aspects and advantages of the present invention will become more apparent from the following detailed description of the present invention when taken in conjunction with the accompanying drawings.

In the figures, reference numerals 10, 11 and 12 denote a multifilamentary oxide superconducting wire, a stabilizer and a filament, respectively.

DESCRIPTION OF THE PREFERRED EMBODIMENTS

Figure 2:
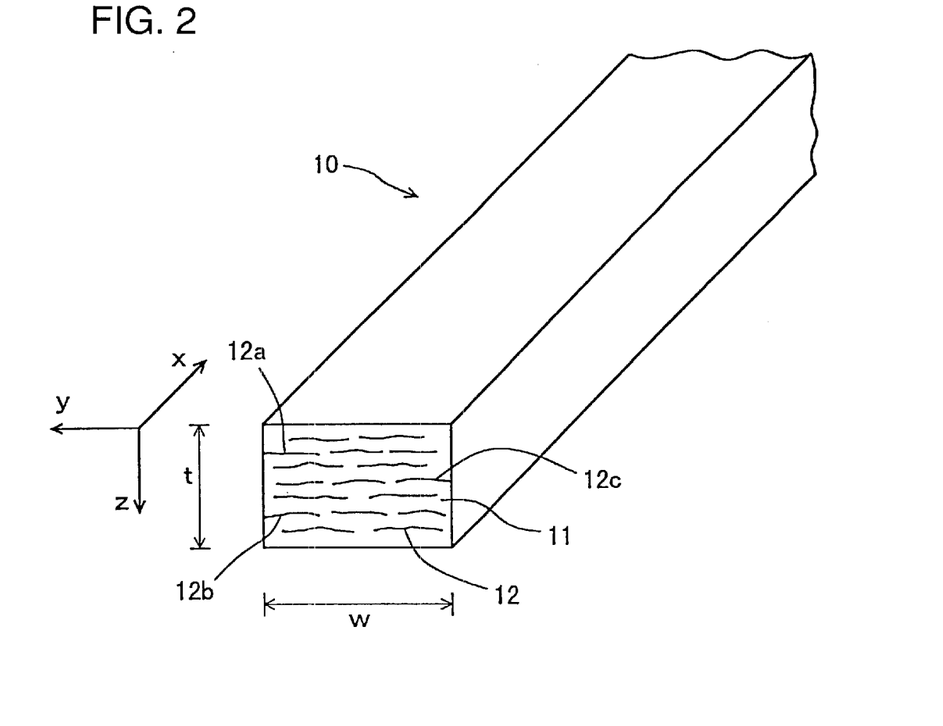
FIG. 2 is a schematic perspective view showing an example of the multifilamentary oxide superconducting wire according to the present invention.
Figure 3:
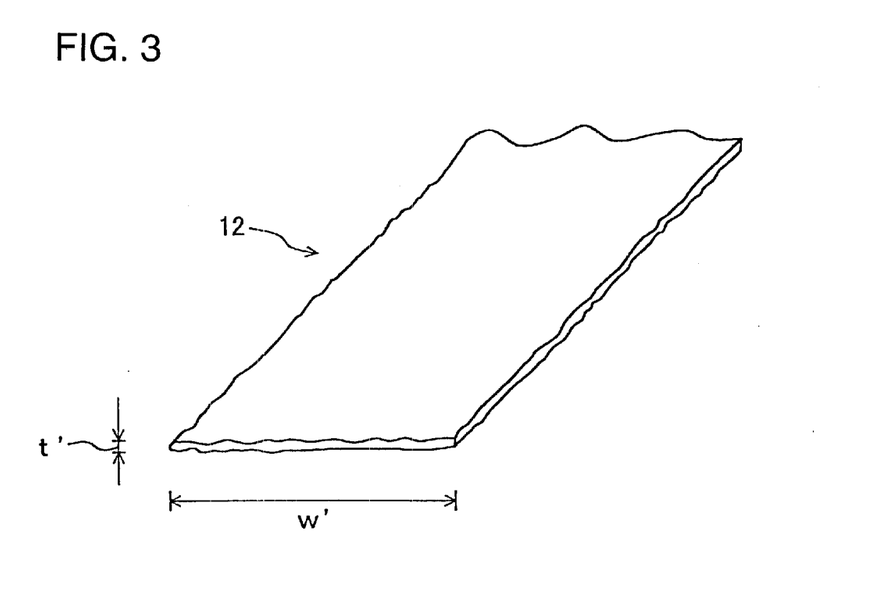
FIG. 3 is a schematic, perspective view showing a typical shape of the filament of the multifilamentary wire shown in FIG. 2 in an enlarged manner.

FIG. 2 shows an example of the multifilamentary wire according to the present invention. Multifilamentary oxide superconducting wire 10 has stabilizer 11 and a plurality of filaments 12 in contact with stabilizer 11. Multifilamentary wire 10 is a monolithic conductor with the matrix of stabilizer 11 and the plurality of filaments 12 combined substantially inseparably. As shown in FIG. 2, in the three axes, the x, y and z axes, perpendicular to one another, the x axis corresponds to the longitudinal direction of multifilamentary wire 10. In this situation, as for the sizes of multifilamentary wire 10 in the directions of the y and z axes, the longer size is defined as "width" and the shorter size is defined as "thickness." In other words, in the present specification, as to the sizes of the wire in the two directions, that are perpendicular to each other and both perpendicular to the longitudinal direction of the wire, the longer size is defined as a "width" and the shorter size is defined as a "thickness." In the present invention, typically, the direction of the thickness of the multifilamentary wire corresponds to the direction of the thickness of the ribbon-shaped filament and the direction of the width of the multifilamentary wire corresponds to the direction of the width of the ribbon-shaped filament, although the opposite correspondence may be applied. In multifilamentary wire 10 of FIG. 2, the y axis corresponds to the direction of the width of the wire and the z axis corresponds to the direction of the thickness of the wire. Multifilamentary wire 10 has a ratio of width w to thickness t (w/t) in the range of 1 to 2. In the present specification, such a ratio of width to thickness are referred to as an aspect ratio. Each of filaments 12 is in the form of a ribbon extending in the longitudinal direction of multifilamentary wire 10. FIG. 3 shows a typical filament of multifilamentary wire 10. The longitudinal direction of filament 12 is typically parallel to that of multifilamentary wire 10. The cross section of filament 12 is a rectangular shape, an elliptical shape or another shape similar thereto. Similarly to multifilamentary wire 10, filament 12 has its "thickness" and "width" in the directions perpendicular to its longitudinal direction. As shown in FIG. 3, filament 12 has thickness t' significantly smaller than width w' and the ratio of the width to the thickness (w'/t') (the aspect ratio of filament 12) is higher than the aspect ratio of multifilamentary wire 10 (w/t). Typically, the filament has an aspect ratio greater than two. The filament may have an aspect ratio (w'/t') greater than seven, typically 7 to 20, preferably 10 to 100, more preferably 10 to 50. In general, crystal grains of the oxide superconductor forming filament 12 are in the shape of a flake extending in the longitudinal direction of filament 12 and typically the c crystal axis of the oxide superconductor is strongly oriented in the direction of the thickness of filament 12. Typically, filament 12 has a layered structure with flake-shaped crystal grains overlapping each other and strongly bonded together.

In multifilamentary wire 10 the plurality of filaments 12 are arranged substantially parallel to each other and arranged in layers. The plurality of filaments have their respective widths oriented substantially in the same direction. Preferably, the distances between each pair of the adjacent filaments are substantially the same in the layered direction. More specifically, it is preferable that the plurality of filaments are substantially uniformly distributed in the layered direction. In multifilamentary wire 10 the plurality of filaments 12 include filaments 12a, 12b and 12c having a portion which is substantially not covered with stabilizer 11. More specifically, filaments 12a, 12b and 12c are partially exposed to the outside of stabilizer 11. This exposure is attributed to the fact that multifilamentary wire 10 is obtained through the cutting step of the process according to the present invention. In the cutting step the oxide filaments are also cut so that the obtained multifilamentary wire has such exposed filaments.

In the multifilamentary wire according to the present invention, one or more filaments may have a portion exposed to the outside of the stabilizer, and the number of such exposed filaments is not limited. According to the present invention, a multifilamentary wire may be provided in which all of the filaments have a portion exposed to the outside of the stabilizer. The number of the filaments having the portion not covered with the stabilizer may be not more than a half or preferably not more than one third of the number of all the filaments. For a specific application, a coating may be provided on the multifilamentary wire so that the portion of the filament or filaments exposed to the outside of the stabilizer can be covered with the coating. Such a coating may preferably be made of an electrically insulating material such as enamel.

In the present invention, the oxide superconductor is typically a bismuth-based oxide superconductor or a thallium-based oxide superconductor. In particular, the superconducting filaments are preferably made of a bismuth-based, 2223-phase oxide superconductor such as $Bi_2Sr_2Ca_2Cu_3O_{10-X}$ and $(Bi, Pb)_2Sr_2Ca_2Cu_3O_{10-X}$ or a bismuth-based, 2212-phase oxide superconductor such as $Bi_2Sr_2Ca_1Cu_2O_{8-X}$ and $(Bi, Pb)_2Sr_2Ca_1Cu_2O_{8-X}$ Preferably, each filament has a single superconducting phase. A typical stabilizer is a noble metal or a noble metal alloy, such as silver or a silver alloy. The silver alloy may include an Ag-Au alloy, an Ag—Mn alloy, an Ag—Al alloy, an Ag—Sb alloy, and an Ag—Ti alloy. In the multifilamentary wire according to the present invention, the ratio of the cross-sectional area of the stabilizer to the cross-sectional area of the filaments, so called the silver ratio, is typically one to five, preferably two to four.

In the multifilamentary wire according to the present invention, each filament may have a thickness of 1 μm to 100 μm, preferably 2 to 50 μm, more preferably 5 to 40 μm. Each filament may have an aspect ratio of 7 to 200, preferably 10 to 100, more preferably 10 to 50. The superconducting phase in the filaments may have the c-axis dominantly oriented in the direction of the thickness of the filament. The c-axis of the crystal grains forming the filaments may form an angle of −20° to +20°, preferably −10° to +10°, more preferably −5° to +5° with the direction of the thickness of each filament. The multifilamentary wire according to the present invention may have 2 to 10000 filaments, preferably 10 to 5000 filaments.

The multifilamentary wire according to the present invention may have a thickness of 0.1 mm to 2 mm, preferably 0.2 mm to 1 mm, and a width of 0.2 mm to 2 mm, preferably 0.5 mm to 1 mm. The multifilamentary wire according to the present invention preferably has such a size that it can constitute a stranded wire. The multifilamentary wire according to the present invention has an aspect ratio of one to two. The multifilamentary wire having such an aspect ratio is suitable as a strand for constituting a stranded wire. Typically, in the multifilamentary wire according to the present invention, the cross section perpendicular to the longitudinal direction thereof is a rectangular shape, a square shape, a polygonal shape having at least five angles, or another shape similar thereto. The aspect ratio of each filament is greater than that of the multifilamentary wire. Typically the filament has an aspect ratio 1.5 to 200 times, preferably 5 to 100 times greater than that of the multifilamentary wire. The multifilamentary wire according to the present invention can have a critical current density (Jc) or a critical current per the cross-sectional area of the superconductor, of at least 10000 A/cm$^2$, typically 10000 to 100000 A/cm$^2$.

Since the multifilamentary wire according to the present invention has ribbon-shaped filaments, it shows anisotropy as to the direction of the magnetic field applied thereto. The multifilamentary wire according to the present invention, however, has a low aspect ratio and can have a Jc comparable to that of a typical, tape-shaped multifilamentary oxide superconducting wire. Thus the present invention is particularly used for a stranded wire.

Figure 4:
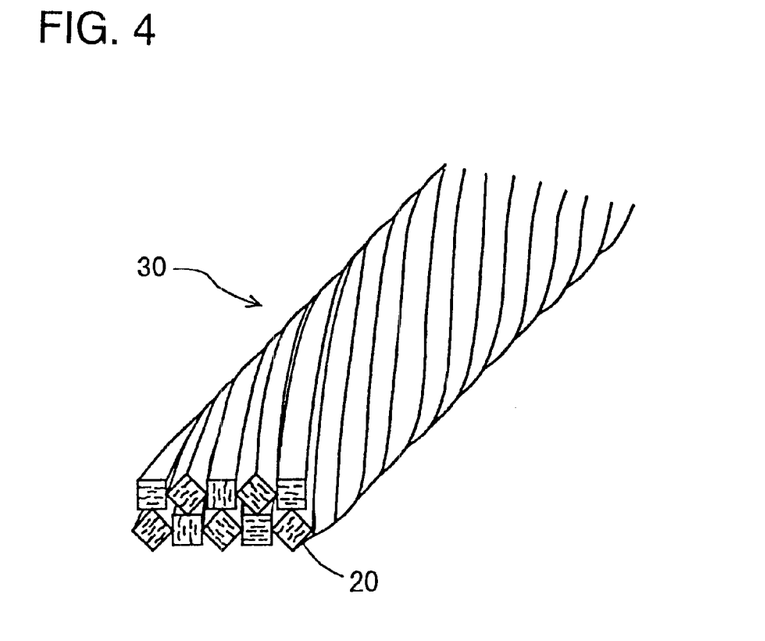
FIG. 4 is a schematic perspective view showing an example of the stranded wire according to the present invention.
Figure 5:
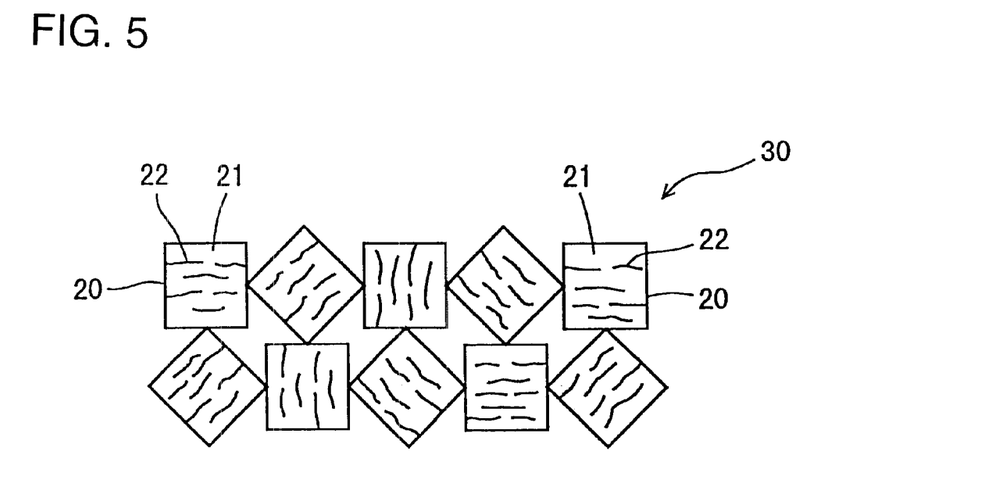
FIG. 5 is a schematic cross section showing a cross section of the stranded wire shown in FIG. 4 in an enlarged manner.

FIGS. 4 and 5 show an example of the stranded wire according to the present invention. A stranded oxide superconducting wire 30 is composed of ten multifilamentary oxide superconducting wires (strands) 20 twined together at a given pitch. The pitch may be one centimeter or more. Multifilamentary wire 20 has an aspect ratio of one. Multifilamentary wire 20 has a stabilizer 21 and a plurality of filaments 22 in contact with stabilizer 21. Multifilamentary wire 20 may have a structure similar to that of multifilamentary wire 10 as shown FIG. 2. In the plurality of filaments 22, some filaments have a portion that is not covered with stabilizer 21. In stranded wire 30, the thickness or width directions of the filaments 22 are not the same but vary among the strands. In other words, the thickness or width directions of the strands are not the same but vary among the strands. These thickness or width directions preferably vary such that a minimized anisotropy can be obtained as to the magnetic field applied. Specifically, the arrangement or orientation of the strands may be changed randomly or regularly so that the thickness or width directions of the strands substantially uniformly vary in the range of 0° to 360°. The variation in the direction of the thickness or width, as described above, can provide the stranded wire with anisotropy reduced as to a magnetic field. The stranded structure can reduce current drift and ac loss.

Figure 6:
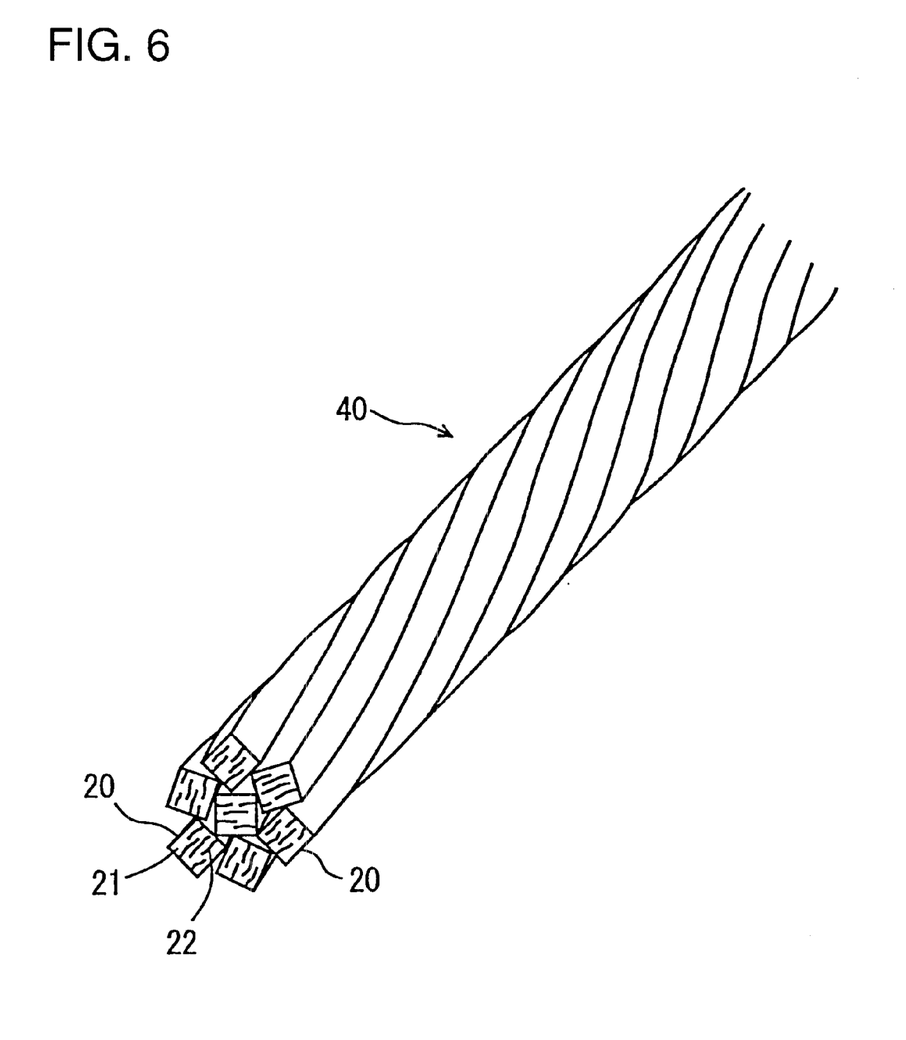
FIG. 6 is a schematic, perspective view showing another example of the stranded wire according to the present invention.

FIG. 6 shows another example of the stranded wire according to the present invention. A stranded, oxide superconducting wire 40 is formed of seven multifilamentary oxide superconducting wires (strands) 20 twined together at a given pitch. The pitch may be one centimeter or more. Multifilamentary wire 20 has an aspect ratio of one. Multifilamentary wire 20 has stabilizer 21 and a plurality of filaments 22 in contact with stabilizer 21. Multifilamentary wire 20 may have a structure similar to that of multifilamentary wire 10 as shown in FIG. 2. The plurality of filaments 22 include some filaments having a portion which is not covered with stabilizer 21.

The stranded wire according to the present invention may be a primary stranded wire in which a plurality of strands are simply twined together, a secondary stranded wire in which primary stranded wires are further twined together, or a tertiary or higher order stranded wire having a further stranded structure. The present invention may include both of a round stranded wire and a flat stranded wire. The stranded wire may be composed of two or more, preferably 7 to 49 strands. The stranded wire may have a pitch of one centimeter or more, preferably two to five centimeters. The pitch of the stranded wire may be five times or more, preferably 10 to 20 times greater than the width of the strand. The stranded wire may or may not be twisted. In the stranded wire according to the present invention, each strand may be covered with an electrically insulating material.

The above-described multifilamentary oxide superconducting wire is obtained by cutting a tape-shaped multifilamentary oxide superconducting wire in the process according to the present invention. The tape-shaped multifilamentary wire is prepared by a powder-in-tube process. In the method according to the present invention, a tape-shaped multifilamentary wire prepared by a typical powder-in-tube process can be used. In a typical powder-in-tube process, oxide superconductor powder or raw-material powder from which an oxide superconductor can be produced is packed into a tube of a stabilizer, and then the tube filled with the powder is subjected to plastic working and heat-treating to provide a wire. The raw-material powder is typically prepared by blending at a given mixing ratio powdery oxides or carbonates of the elements constituting the superconductor, sintering the mixture and then grinding the sintered material. The raw-material powder is packed into a tube. The tube to be filled with the powder is typically made of silver or a silver alloy. The tube filled with the powder is subjected to plastic working, such as drawing, rolling, and pressing. To obtain a multifilamentary wire, typically, a plurality of round wires obtained through drawing are packed into a tube and then drawn and rolled to give a tape-shaped multifilamentary wire. The tape-shaped multifilamentary wire thus obtained is heat-treated at an appropriate temperature to produce a sintered body of the oxide superconductor. After the heat treatment, the multifilamentary wire is preferably rolled again and heat-treated for sintering.

In the method according to the present invention, the tape-shaped multifilamentary wire which has been heat-treated for sintering is preferably subjected to the cutting step. A preferable process from the last rolling step that produces a tape-shaped multifilamentary wire may be:

(A) rolling-sintering-rolling-cutting-sintering, or (B) rolling-sintering-rolling-sintering-cutting.

In process A, a thermal treatment for sintering is followed by rolling and then followed by cutting and sintering. In process B, a thermal treatment for sintering is followed by rolling and sintering, and then followed by cutting. In either process, the rolling step after the first sintering step can increase the density of the sintered body, resulting in improved Jc.

In the method according to the present invention, a cut or cuts are made in the tape-shaped, multifilamentary oxide superconducting wire prepared by the powder-in-tube process in its longitudinal direction to produce a plurality of multifilamentary oxide superconducting wires each having a width smaller than that of the tape-shaped wire. The present inventor has found that even if the tape-shaped multifilamentary wire is cut in its longitudinal direction, the superconducting properties do not deteriorate significantly. In the cutting step, press cutting, a wheel saw with a hard material such as diamond, water-jet, or laser (e.g., a laser blade) may be used to cut the tape-shaped wire. The portion to be cut may be subjected to any of these means, so that the original, tape-shaped wire is divided into wires having a width smaller than the original. Preferably, the tape-shaped multifilamentary wire used has an aspect ratio of at least ten (10 to 30 for example), more preferably at least 15 (15 to 25 for example). The tape-shaped multifilamentary wire used may have a thickness of 0.1 to 2 mm, preferably 0.2 to 1 mm, and a width of 2 to 20 mm, preferably 4 to 10 mm. A specific manner of the cutting will be described below.

Figure 7:
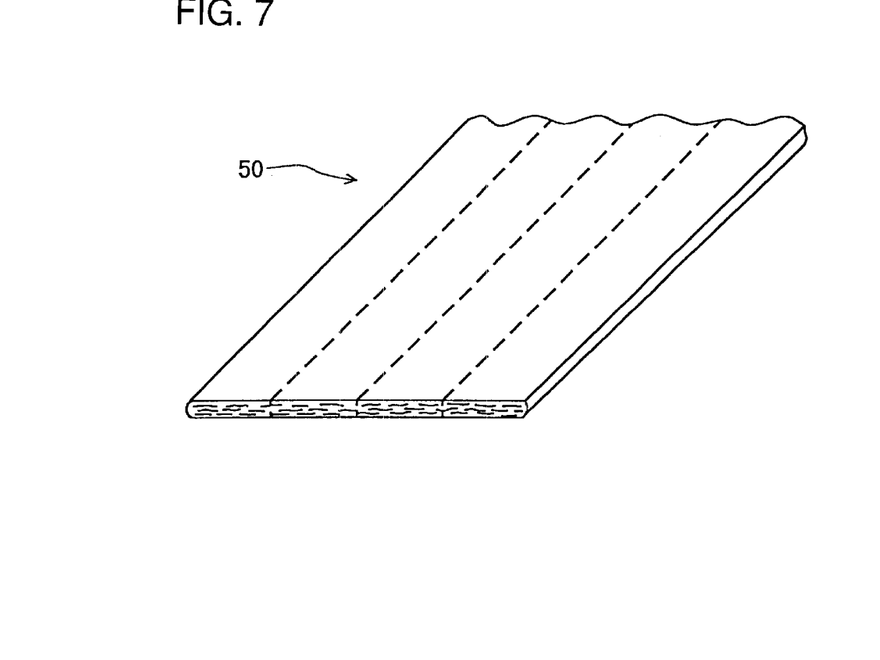
FIG. 7 is a schematic, perspective view showing an example of the cutting step of the production method according to the present invention.
Figure 8A:
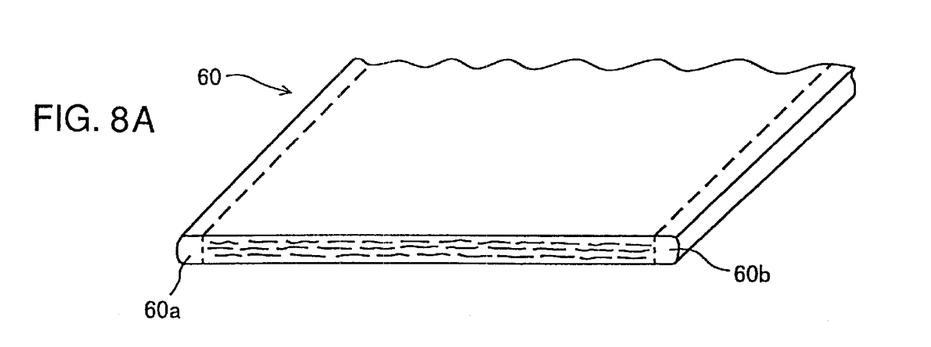
FIGS. 8A and 8B are schematic perspective views showing another example of the cutting step of the production method according to the present invention.
Figure 8B:
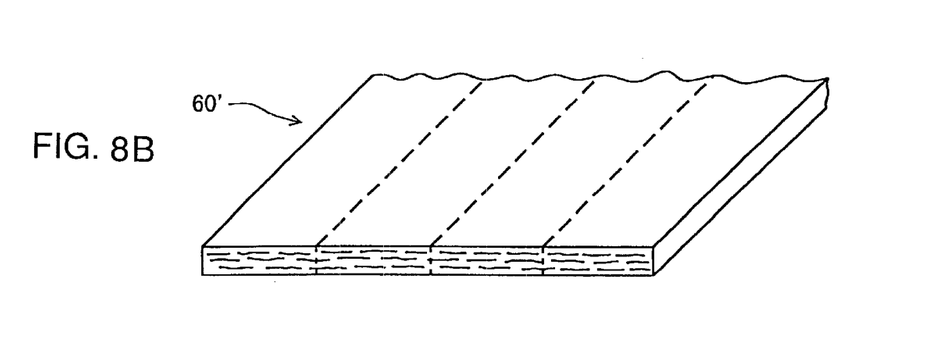
Figure 9:
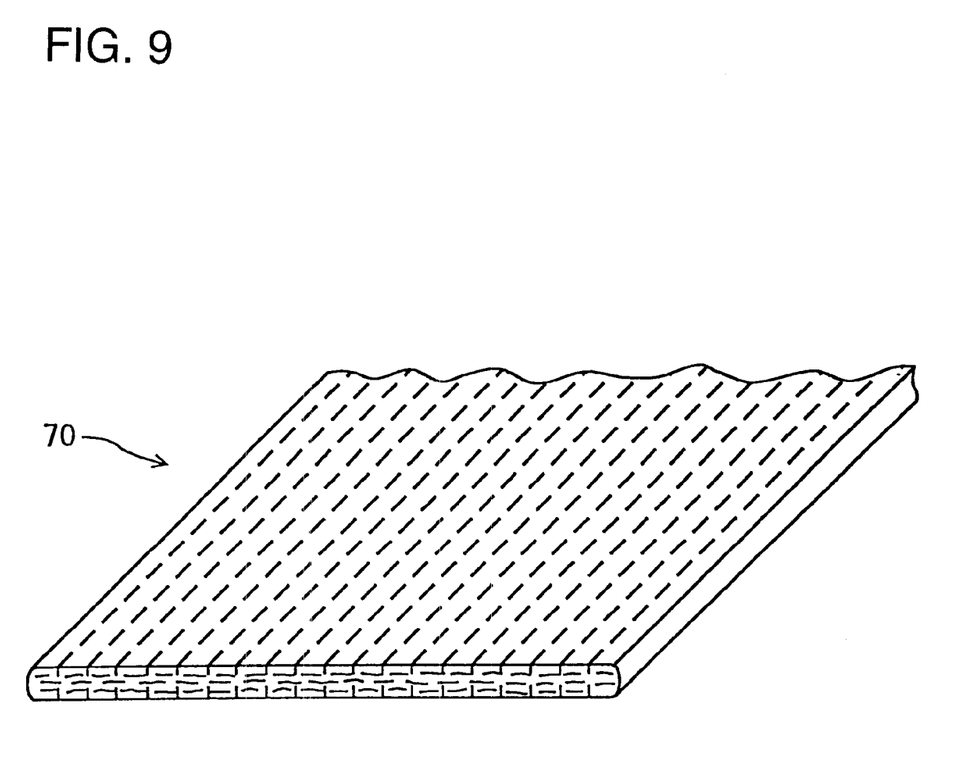
FIG. 9 is a schematic, perspective view showing still another example of the cutting step of the production method according to the present invention.

In an embodiment according to the present invention, a tape-shaped multifilamentary wire 50 may be cut along the dotted lines as shown in FIG. 7. The dotted lines are all parallel to the longitudinal direction of tape-shaped multifilamentary wire 50. By the cutting, tape-shaped multifilamentary wire 50 is divided into four narrow multifilamentary wires each having an aspect ratio of approximately five. In another embodiment according to the present invention, as shown in FIG. 8A, cuts are made along the dotted lines to remove filament-free portions 60a and 60b at both ends of a tape-shaped multifilamentary wire 60. The dotted lines are parallel to the longitudinal direction of multifilamentary wire 60. Any of the above-described means may be used for the cutting. As shown in FIG. 8B, cuts are then made in a tape-shaped multifilamentary wire 60' along the dotted lines. The dotted lines are parallel to the longitudinal direction of multifilamentary wire 60'. By the cutting, multifilamentary wire 60' is divided into eight narrow multifilamentary wires having an aspect ratio of approximately two. Initially removing a filament-free portion or portions can provide a more compact wire, having a reduced cross-sectional area per unit volume. The steps as shown in FIGS. 8A and 8B are advantageous, when the filament-free end portion or portions occupy a significant volume in the tape-shaped multifilamentary wire. In still another embodiment according to the present invention, a tape-shaped multifilamentary wire 70 may be cut along the dotted lines as shown in FIG. 9. By the cutting, tape-shaped multifilamentary wire 70 is divided into 20 wires having an aspect ratio of approximately one.

In the cutting steps shown in FIGS. 7, 8A and 8B, and 9, some filaments are cut and partially exposed to the outside of the obtained multifilamentary wires. Such wires may be used as they are, or a coating may be formed on them to cover the exposed filaments.

One advantage of the cutting step is that a narrow wire or wires can be obtained through a relatively simple operation. For example, when a tape-shaped multifilamentary wire of 4 mm in width and 0.2 mm in thickness is cut into four aliquots, four wires each having a width of 1 mm and a thickness of 0.2 mm, and thus having an aspect ratio of five, can readily be obtained. When the tape-shaped multifilamentary wire is cut into 20 aliquots, 20 wires each having a width of 0.2 mm and a thickness of 0.2 mm, and thus having an aspect ratio of one, can readily be obtained. In these examples, the original tape-shaped multifilamentary wire can have substantially uniform superconducting properties such as Jc and Ic over the cross section. Therefore, the wires obtained by cutting the original multifilamentary wire can also have substantially the same superconducting properties. Thus, narrow multifilamentary wires having characteristics as required can be obtained through a relatively simple operation at a high yield. In contrast, various problems arise if plastic working is employed to obtain a narrow wire. In particular, plastic working to reduce the width to one millimeter or less tends to produce sausage-like filaments (i.e., filaments being in the shape of wave rather than being linear in its longitudinal direction) or tends to cut the filaments into fragments, so that a wire having preferable superconducting properties can hardly be obtained. In contrast, the narrow wires obtained by cutting the original, tape-shaped multifilamentary wire can substantially maintain the same superconducting properties as the original.

After the cutting step, the obtained wires may be used as they are, or they may be heat-treated for sintering. On the other hand, the wires obtained through the cutting step may be processed. The wire obtained through the cutting step typically has a rectangular or square cross section, or other cross sections similar thereto. Such a cross section can be changed by processing the wire to a more suitable shape for producing a stranded wire. For example, the wire may be processed (e.g., chamfered) to have its corner or corners removed. The chamfered wire typically has a polygonal cross section, such as an octagon. Such a processed wire is more suitable for a stranded wire. After such a process, the wire may be heat-treated for sintering.

Figure 10:
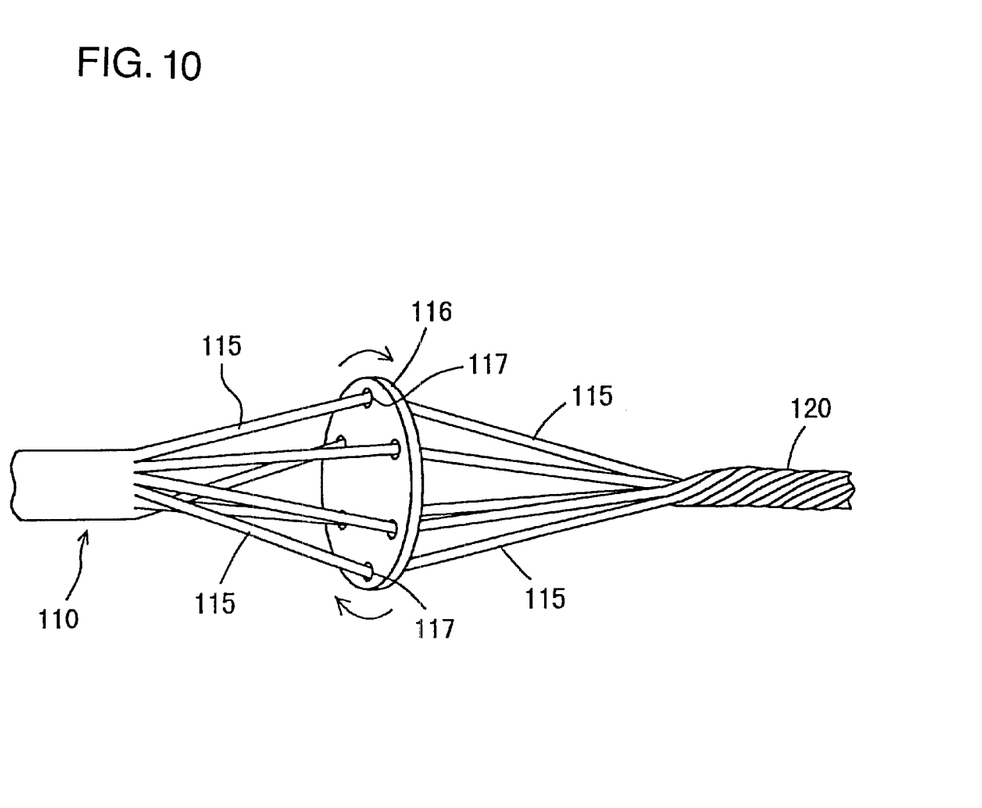
FIG. 10 is a schematic, perspective view showing a process in which the cutting step and the twining step are carried out simultaneously in a preferable mode of the present invention.

After the cutting step, the obtained wires can be twined together by a typical method. The stranding or twining pitch and the orientation of the strands (i.e., the orientation of the thickness or the width of each strand in the stranded wire) can be controlled typically by modulating the revolution rate of the wire-supplying part. As shown in FIG. 10, wires may also be cut and twined together simultaneously. A plurality of cutting means (e.g., a plurality of wheel saws) (not shown) are used to divide a tape-shaped multifilamentary wire 110 into narrow wires 115 and simultaneously a number of wires 115 are twined together via a rotating element 116 to provide a stranded wire 120. Rotating element 116 has holes 117, the number of which corresponds to that of the wires to be twined. Rotating element 116 rotating at a desired rate receives wires 115 at holes 117, respectively, to provide stranded wire 120. Alternatively, wires having a low aspect ratio resulting from the cutting step may be covered with an electrically insulating material and then the covered wires may be twined together.

Hereinafter the present invention will more specifically be described with reference to examples, although the present invention is, not limited to thereto.

EXAMPLE 1

Oxide powder and carbonate powder as starting materials were mixed to give a mixture having a Bi:Pb:Sr:Ca:Cu composition ratio of 1.8:0.3:1.9:2.0:3.0. Heat treatment at 700° C. to 860° C. and grinding are performed on the mixture twice or more to prepare powder for packing. The obtained powder was packed into a silver pipe having an inner diameter of 10 mm and an outer diameter of 12 mm and then the pipe filled with the powder was drawn. The resulting wire having a diameter of 1.1 mm was cut to prepare 61 wires for engagement. The 61 wires for engagement were packed into a silver pipe having an inner diameter of 10 mm and an outer diameter of 12 mm, and then the pipe filled with the wires were drawn and rolled to give a tape-shaped wire having a width of 3.8 mm and a thickness of 0.25 mm. The tape-shaped wire was heated at approximately 850° C. under the atmosphere for sintering. After cooled, the tape-shaped wire was rolled to have a width of 4.2 mm and a thickness of 0.20 mm. It was heat-treated again at approximately 850° C. under the atmosphere and cooled to provide a tape-shaped multifilamentary wire of 10 m in length. This tape-shaped multifilamentary wire was 4.2 mm wide and 0.2 mm thick and had a critical current (Ic) of 60 A at the liquid nitrogen temperature without a magnetic field applied. Thus, it was calculated that the tape had a critical current value per unit area (overall Jc) of approximately $7.14 \times 10^3 A/cm^2$ (60 A/(0.42 cm×0.02 cm)).

From the tape-shaped multifilamentary wire of ten meters long, filament-free, 0.1 mm-wide portions at both ends were cut off with a diamond cutter. A wheel saw was used for the diamond cutter. The tape-shaped multifilamentary wire having the both end portions removed had a critical current of 58 A. Its overall Jc was approximately $7.25 \times 10^3$ A/cm² (58 A/(0.4 cm×0.02 cm)), which is a slightly larger value than the initial Jc. Then, the tape-shaped multifilamentary wire was further cut with the diamond cutter and divided into four wires of one millimeter in width. The obtained four wires had critical currents of 15 A, 14 A, 15 A and 14 A respectively. The wires having an Ic of 15 A had an overall Jc of $7.5 \times 10^3$ A/cm²(15 A/(0.1 cm×0.02 cm)) and the wires having an Ic of 14 A had an overall Jc of $7.0 \times 10^3$ A/cm² (14 A/(0.1 cm×0.02 cm)). The four wires obtained all had their respective Jc close to that of the original tape-shaped multifilamentary wire. It has been understood that multifilamentary wires having a low aspect ratio and a relatively high Jc can be produced through the cutting step.

Other tape-shaped multifilamentary wires were prepared for the cutting step. Those had the same cross-sectional area but different aspect ratios. Table 1 shows the relationship between the aspect ratios and the Ic at to the prepared tape-shaped wires. It is understood from the table that tape-shaped multifilamentary wires having an aspect ratio of at least ten are more preferable for the cutting step.

TABLE 1

| Width (mm) | 4 | 3.5 | 3 | 2 | 1 |
|---|---|---|---|---|---|
| Thickness (mm) | 0.2 | 0.228 | 0.265 | 0.4 | 0.8 |
| Aspect Ratio | 20 | 16 | 11 | 5 | 1.25 |
| Critical Current (A) | 70 | 65 | 55 | 22 | 9 |

EXAMPLE 2

Except for the shape of the finally obtained wire, a process similar to that employed in Example 1 was employed to prepare a 61-filament, tape-shaped wire of one meter in length, 10 mm in width and 1 mm in thickness, whose aspect ratio is ten. The obtained multifilamentary wire had an Ic of 600 A. This multifilamentary wire was divided by means of a diamond cutter into ten aliquots to give ten wires each having a length of one millimeter, a width of 1 mm and a thickness of 1 mm, and having an aspect ratio of one. Each wire had a square cross section. Each wire whose aspect ratio is one had substantially the same overall Jc as the original, tape-shaped wire. The obtained ten wires were manually twined together to provide a stranded wire. The obtained stranded wire had an Ic of approximately 580 A at the liquid nitrogen temperature without a magnetic field applied.

According to the present invention, multifilamentary oxide superconducting wires having a relatively high Jc and a low aspect ratio can be provided. Such multifilamentary wires are more suitable for applications such as stranded wires and solenoid coils. According to the present invention, stranded wires having a relatively high Jc can also be provided. In such stranded wires, ac loss can be small, so that they can be more suitable for energy transfer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a multifilamentary oxide superconducting wire, comprising the steps of:

making a cut or cuts in a longitudinal direction in a tape-shaped multifilamentary oxide superconducting wire prepared by a powder-in-tube process, so that a plurality of multifilamentary oxide superconducting wires each having a width smaller than that of said tape-shaped wire are obtained from said tape-shaped wire.

2. The method of claim 1, wherein said tape-shaped wire has an aspect ratio of at least ten.

3. The method of claim 2, wherein said multifilamentary oxide superconducting wires smaller in width have an aspect ratio of one to two.

4. The method of claim 1, wherein said multifilamentary oxide superconducting wires smaller in width have an aspect ratio of one to two.

5. The method of claim 4, wherein said oxide is a bismuth-based oxide.

6. The method of claim 1, wherein said oxide is a bismuth-based oxide.

7. The method of claim 2, wherein said oxide is a bismuth-based oxide.

8. A method of producing a stranded oxide superconducting wire, comprising the step of twining a required number of multifilamentary oxide superconducting wires obtained by the method of claim 1.

9. The method of claim 8, wherein said tape-shaped wire has an aspect ratio of at least ten.

10. The method of claim 8, wherein said multifilamentary oxide superconducting wires smaller in width have an aspect ratio of one to two.

11. The method of claim 8, wherein said oxide is a bismuth-based oxide.

12. A multifilamentary oxide superconducting wire comprising a stabilizer and a plurality of filaments made of an oxide superconductor in contact with said stabilizer, wherein said multifilamentary oxide superconducting wire has an aspect ratio of one to two, said plurality of filaments are in the shape of a ribbon extending in a longitudinal direction of said multifilamentary wire, said plurality of filaments are arranged substantially parallel to each other and in layers, said plurality of filaments have an aspect ratio greater than that of said multifilamentary wire, and said plurality of filaments include a filament or filaments having a portion along the longitudinal direction substantially not covered with said stabilizer.

13. The multifilamentary oxide superconducting wire of claim 12, wherein said filaments have an aspect ratio greater than two.

14. The multifilamentary oxide superconducting wire of claim 13, wherein said oxide superconductor is a bismuth-based oxide superconductor.

15. The multifilamentary oxide superconducting wire of claim 12, wherein said oxide superconductor is a bismuth-based oxide superconductor.

16. A stranded oxide superconducting wire, which is composed of a plurality of the multifilamentary oxide superconducting wire of claim 12 twined together.

17. The stranded oxide superconducting wire of claim 16, wherein said filaments have an aspect ratio greater than two.

18. The stranded oxide superconducting wire of claim 17, wherein said oxide superconductor is a bismuth-based oxide superconductor.

19. The stranded oxide superconducting wire of claim 16, wherein said oxide superconductor is a bismuth-based oxide superconductor.

* * * * *